(12) United States Patent
Ning et al.

(10) Patent No.: US 11,928,357 B2
(45) Date of Patent: Mar. 12, 2024

(54) METHOD AND SYSTEM FOR ADJUSTING MEMORY, AND SEMICONDUCTOR DEVICE

(71) Applicant: CHANGXIN MEMORY TECHNOLOGIES, INC., Hefei (CN)

(72) Inventors: Shu-Liang Ning, Hefei (CN); Jun He, Hefei (CN); Zhan Ying, Hefei (CN); Jie Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 118 days.

(21) Appl. No.: 17/577,611

(22) Filed: Jan. 18, 2022

(65) Prior Publication Data

US 2022/0137872 A1    May 5, 2022

Related U.S. Application Data (63) Continuation of application No. PCT/CN2021/103838, filed on Jun. 30, 2021.

(30) Foreign Application Priority Data

Aug. 27, 2020 (CN) .......................... 202010879444.2

(51) Int. Cl.
   *G06F 3/06* (2006.01)

(52) U.S. Cl.
   CPC .......... *G06F 3/0655* (2013.01); *G06F 3/0604* (2013.01); *G06F 3/0653* (2013.01); *G06F 3/0679* (2013.01)

(58) Field of Classification Search
   CPC .... G06F 3/0655; G06F 3/0604; G06F 3/0653; G06F 3/0679; G11C 2207/2254;
   (Continued)

(56) References Cited

U.S. PATENT DOCUMENTS 4,806,801 A    2/1989  Argade
5,768,189 A    6/1998  Takahashi
(Continued)

FOREIGN PATENT DOCUMENTS

CN    1409288 A    4/2003
CN    101004945 A    7/2007
(Continued)

OTHER PUBLICATIONS

Notice of Allowance of the U.S. Appl. No. 17/449,573, dated Apr. 5, 2023. 36 pages.
(Continued)

*Primary Examiner* — Masud K Khan
(74) *Attorney, Agent, or Firm* — Cooper Legal Group, LLC (57) ABSTRACT

Embodiments of this application provide a method and system for adjusting a memory, and a semiconductor device. The method for adjusting a memory includes: acquiring a mapping relationship among a temperature of a transistor, a substrate bias voltage of a sense amplification transistor in a sense amplifier, and an actual data writing time of the memory; acquiring a current temperature of the transistor; and adjusting the substrate bias voltage on the basis of the current temperature and the mapping relationship, such that an actual data writing time corresponding to an adjusted substrate bias voltage is within a preset writing time.

13 Claims, 5 Drawing Sheets

(58) Field of Classification Search
CPC .......... G11C 11/4074; G11C 11/4091; G11C 11/4076; G11C 7/04; G11C 29/021; G11C 29/028; G11C 11/40; G11C 11/4063

See application file for complete search history.

(56) References Cited

U.S. PATENT DOCUMENTS

| | | | |
|---|---|---|---|
| 5,978,941 | A | 11/1999 | Katayama |
| 6,223,311 | B1 | 4/2001 | Katayama |
| 6,694,460 | B2 | 2/2004 | Katayama |
| 6,754,120 | B1 | 6/2004 | Bellows |
| 6,944,057 | B1 | 9/2005 | Runnion |
| 7,196,926 | B1 | 3/2007 | Kim |
| 7,313,044 | B2 | 12/2007 | Fuhrmann |
| 7,379,355 | B2 | 5/2008 | Kim |
| 7,529,145 | B2 | 5/2009 | La Rosa |
| 7,577,014 | B2 | 8/2009 | Yamagami |
| 7,817,460 | B2 | 10/2010 | Yamagami |
| 7,995,414 | B2 | 8/2011 | Ito |
| RE46,110 | E | 8/2016 | Kajigaya |
| 9,484,083 | B2 | 11/2016 | Moriwaki |
| 10,957,365 | B2 | 3/2021 | Lovett |
| 2001/0010086 | A1 | 7/2001 | Katayama |
| 2002/0024378 | A1 | 2/2002 | Forbes |
| 2002/0154545 | A1 | 10/2002 | Tanaka |
| 2003/0021161 | A1 | 1/2003 | Fifield |
| 2005/0036362 | A1 | 2/2005 | Iwata |
| 2005/0174164 | A1 | 8/2005 | Fuhrmann |
| 2006/0133172 | A1 | 6/2006 | Schnabel |
| 2006/0220689 | A1 | 10/2006 | Kang |
| 2006/0274590 | A1 | 12/2006 | Fujita |
| 2007/0165474 | A1 | 7/2007 | Kim |
| 2007/0194381 | A1 | 8/2007 | Chun |
| 2007/0206404 | A1 | 9/2007 | Yamagami |
| 2008/0238530 | A1 | 10/2008 | Ito |
| 2009/0245003 | A1 | 10/2009 | Ito |
| 2009/0251947 | A1* | 10/2009 | Kajigaya ............... G11C 5/147 365/189.11 |
| 2009/0279347 | A1 | 11/2009 | Yamagami |
| 2010/0329026 | A1 | 12/2010 | Nakamura |
| 2012/0020169 | A1 | 1/2012 | Wang |
| 2012/0033487 | A1 | 2/2012 | Inoue |
| 2012/0275235 | A1 | 11/2012 | Parker |
| 2014/0092675 | A1 | 4/2014 | Wang et al. |
| 2015/0279449 | A1 | 10/2015 | Moriwaki |
| 2015/0310938 | A1 | 10/2015 | Kim et al. |
| 2016/0118106 | A1 | 4/2016 | Yoshimura et al. |
| 2017/0005641 | A1 | 1/2017 | Chhabra |
| 2017/0278578 | A1 | 9/2017 | Nagai et al. |
| 2018/0114550 | A1 | 4/2018 | Cho |
| 2020/0075063 | A1 | 3/2020 | Lovett |
| 2020/0082894 | A1 | 3/2020 | Singh et al. |
| 2020/0185011 | A1* | 6/2020 | Park ................... H01L 23/473 |
| 2020/0343245 | A1 | 10/2020 | Yamazaki et al. |
| 2020/0402577 | A1 | 12/2020 | Onuki |
| 2022/0148660 | A1 | 5/2022 | Hioka |

FOREIGN PATENT DOCUMENTS

| | | |
|---|---|---|
| CN | 101030447 A | 9/2007 |
| CN | 101593552 A | 12/2009 |
| CN | 103474093 A | 12/2013 |
| CN | 103677966 A | 3/2014 |
| CN | 104952481 A | 9/2015 |
| CN | 105023609 A | 11/2015 |
| CN | 105677593 A | 6/2016 |
| CN | 205845518 U | 12/2016 |
| CN | 107358976 A | 11/2017 |
| CN | 107978329 A | 5/2018 |
| CN | 108109646 A | 6/2018 |
| CN | 108447511 A | 8/2018 |
| CN | 110875070 A | 3/2020 |
| CN | 110910925 A | 3/2020 |
| CN | 111009276 A | 4/2020 |
| CN | 111292776 A | 6/2020 |
| CN | 111316423 A | 6/2020 |
| CN | 111373476 A | 7/2020 |
| EP | 2444406 A1 | 4/2012 |
| EP | 3944248 A1 | 1/2022 |
| JP | H05266658 A | 10/1993 |
| JP | H0950325 A | 2/1997 |
| JP | H09265787 A | 10/1997 |
| JP | H10105533 A | 4/1998 |
| JP | 2003196991 A | 7/2003 |
| JP | 3942425 B2 | 7/2007 |
| JP | 2008004153 A | 1/2008 |
| JP | 2008270732 A | 11/2008 |
| JP | 2009295246 A | 12/2009 |
| JP | 2012161090 A | 8/2012 |
| KR | 20060131561 A | 12/2006 |
| KR | 20100129991 A | 12/2010 |
| WO | 9720625 A1 | 6/1997 |
| WO | 2019130144 A1 | 7/2019 |

OTHER PUBLICATIONS

Notice of Allowance of the Chinese application No. 202010880909.6, dated Jun. 1, 2023. 1 page with English translation, 5 pgs.
English translation of the Written Opinion of the International Search Authority in the international application No. PCT/CN2021/100697, dated Aug. 27, 2021. 4 pages.
First Office Action of the U.S. Appl. No. 17/452,339, dated Apr. 27, 2023. 74 pages.
First Office Action of the Chinese application No. 202010879440.4, dated May 27, 2023. 1 page with English translation, 12 pgs.
English translation of the Written Opinion of the International Search Authority in the international application No. PCT/CN2021/106093, dated Oct. 11, 2021. 4 pages.
Notice of Allowance of the U.S. Appl. No. 17/510,453, dated Apr. 18, 2023. 26 pages.
Notice of Allowance of the Chinese application No. 202010880935.9, dated Jun. 14, 2023. 1 page with English translation, 5 pgs.
English translation of the Written Opinion of the International Search Authority in the international application No. PCT/CN2021/106060, dated Oct. 20, 2021. 4 pages.
First Office Action of the Chinese application No. 202010879444.2, dated May 30, 2023. 1 page with English translation, 8 pgs.
English translation of the Written Opinion of the International Search Authority in the international application No. PCT/CN2021/103838, dated Sep. 28, 2021. 3 pages.
International Search Report in the international application No. PCT/CN2021/106060, dated Oct. 20, 2021, 2 pgs.
International Search Report in the international application No. PCT/CN2021/103838, dated Sep. 28, 2021, 2 pgs.
International Search Report in the international application No. PCT/CN2021/106093, dated Oct. 11, 2021, 2 pgs.
International Search Report in the international application No. PCT/CN2021/100697, dated Aug. 27, 2021, 2 pgs.
Supplementary European Search Report in the European application No. 21859863.9, dated Aug. 31, 2023, 23 pages.
Supplementary European Search Report in the European application No. 21859939.7, dated Jul. 3, 2023, 9 pages.

\* cited by examiner

METHOD AND SYSTEM FOR ADJUSTING MEMORY, AND SEMICONDUCTOR DEVICE

CROSS-REFERENCE TO RELATED APPLICATION

This application is a continuation application of International Patent Application No. PCT/CN2021/103838, filed on Jun. 30, 2021, which claims priority to Chinese Patent Application No. 202010879444.2, filed on Aug. 27, 2020. International Patent Application No. PCT/CN2021/103838 and Chinese Patent Application No. 202010879444.2 are incorporated herein by reference in their entireties.

TECHNICAL FIELD

Embodiments of this application relate to the field of semiconductors, and in particular, to a method and system for adjusting a memory, and a semiconductor device.

BACKGROUND

As one of three essential components of a computer, a memory is a key device that determines system performance. The memory is like a temporary warehouse, responsible for the transfer and temporary storage of data.

A key performance indicator of the memory is the time for the memory to read/write data. Data writing of the memory is not to write data instantly into a storage capacitor, because the turn-on of a transistor and the charging of the capacitor necessarily takes a period of time, i.e., the data writing for the memory requires a certain writing cycle. In order to ensure the accuracy of data writing, sufficient data writing time is always reserved.

However, an actual data writing time of the memory is affected by temperature, causing the actual data writing time of the memory to be longer than the reserved sufficient data writing time. As a result, the data is not completely written into the storage capacitor.

SUMMARY

A first aspect of embodiments of this application provides a method for adjusting a memory. The memory includes a transistor, a gate of the transistor is electrically connected to a word line of the memory, one of a pair of source/drain ends of the transistor is electrically connected to a bit line of the memory by means of a sense amplifier and the other one of the pair of source/drain ends of the transistor is electrically connected to a storage capacitor of the memory, and the method includes: acquiring a mapping relationship among a temperature of the transistor, a substrate bias voltage of a sense amplification transistor in the sense amplifier, and an actual data writing time of the memory; acquiring a current temperature of the transistor; and adjusting the substrate bias voltage on the basis of the current temperature and the mapping relationship, such that an actual data writing time corresponding to an adjusted substrate bias voltage is within a preset writing time.

A second aspect of the embodiments of this application provides a system for adjusting a memory, including: a first acquiring module configured to acquire a mapping relationship among a temperature of a transistor, a substrate bias voltage of a sense amplification transistor in a sense amplifier, and an actual data writing time of the memory; a second acquiring module configured to acquire a current temperature of the transistor; a processing module configured to acquire an adjusting mode of the substrate bias voltage on the basis of the current temperature and the mapping relationship; and an adjusting module configured to adjust the substrate bias voltage on the basis of the adjusting mode, such that the actual data writing time corresponding to the adjusted substrate bias voltage is within a preset writing time.

A third aspect of the embodiments of this application provides a semiconductor device, including a memory and the system for adjusting a memory. The system for adjusting a memory adjusts the substrate bias voltage of the sense amplification transistor in the sense amplifier on the basis of the temperature of the transistor in the memory, so that the actual data writing time of the memory corresponding to the adjusted substrate bias voltage is within the preset writing time.

BRIEF DESCRIPTION OF THE DRAWINGS

One or more embodiments are exemplarily illustrated by figures in the corresponding accompanying drawings. These exemplary descriptions do not constitute a limitation to the embodiments. Unless otherwise stated, the figures in the accompanying drawings do not constitute a scale limitation.

DETAILED DESCRIPTION

An actual data writing time of a memory is affected by temperature, causing the actual data writing time to be longer than a reserved sufficient data writing time, as a result, the data is not completely written into a storage capacitor.

In order to solve the problem above, the first embodiment of this application provides a method for adjusting a memory. The memory includes a transistor. A gate of the transistor is electrically connected to a Word Line (WL) of the memory, and one of a pair of source/drain ends of the transistor is electrically connected to a Bit Line (BL) of the memory via a Sense Amplifier (SA) and the other one of the pair of source/drain ends is electrically connected to a storage capacitor of the memory. The method for adjusting a memory includes: acquiring a mapping relationship among temperatures of the transistor, substrate bias voltages of a sense amplification transistor in the SA, and actual data writing times of the memory; acquiring a current temperature of the transistor; and adjusting the substrate bias on the basis of the current temperature and the mapping relationship, such that the actual data writing time corresponding to the adjusted substrate bias voltage is within a preset writing time.

To describe the purposes, the technical solutions and the advantages of the embodiments of this application more clearly, the embodiments of this application are described in detail below with reference to the accompanying drawings. However, a person of ordinary skill in the art can understand that in the embodiments of this application, numerous technical details are proposed for readers to better understand this application. However, even without these technical details and various changes and modifications based on the following embodiments, the technical solutions claimed in this application can be implemented. The division of the following embodiments is for the convenience of description, and shall not constitute any limitation to the specific implementation modes of this application, and the embodiments can be combined with each other and refer to each other without contradiction.

Figure 3:
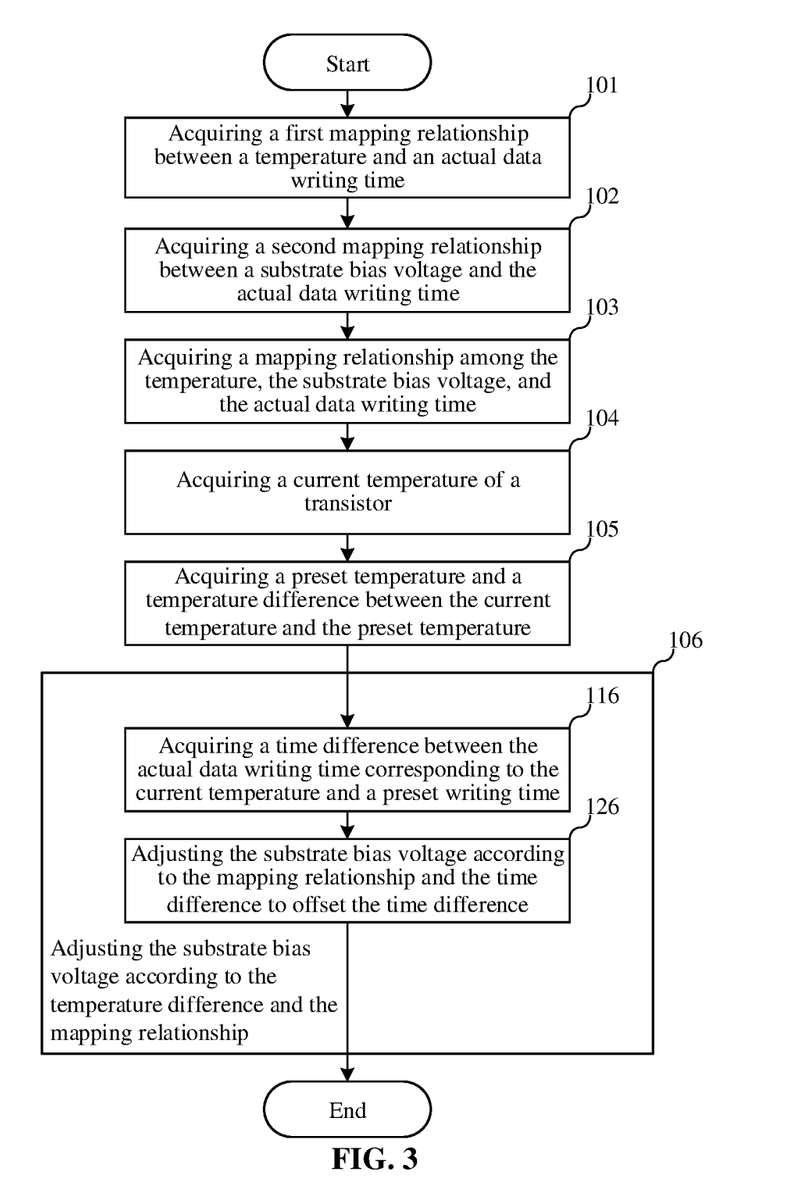
FIG. 3 is a schematic flowchart of a method for adjusting a memory according to the first embodiment of this application.

FIG. 3 is a schematic flowchart of a method for adjusting a memory according to an embodiment of this application, and the method for adjusting a memory of this embodiment is specifically described below.

Figure 1:
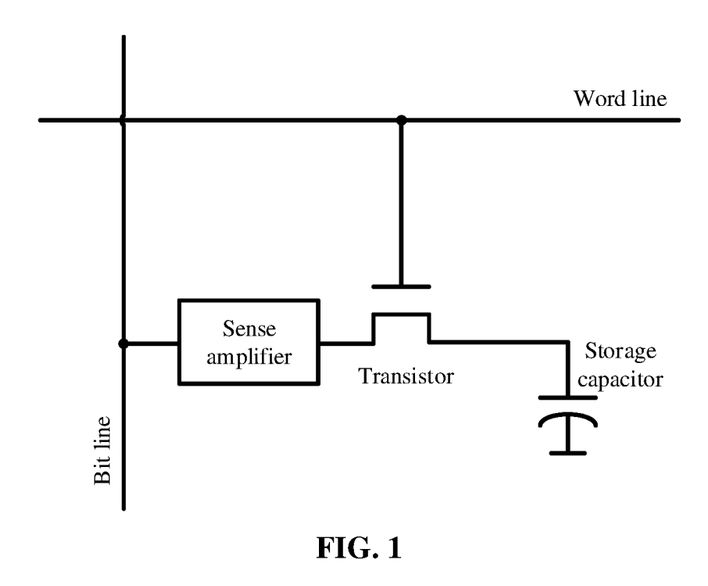
FIG. 1 is a schematic structural diagram of connection of a transistor of a memory according to a first embodiment of this application.

Referring to FIG. 1, FIG. 1 is a schematic structural diagram of a single storage unit in a memory. The memory includes multiple storage capacitors. The selection of a target storage capacitor is implemented by means of a BL structure and a WL structure, the WL structure is connected to the gate of the transistor, the BL structure is connected to one of the pair of source/drain ends of the transistor via the SA, and the other one of the pair of source/drain ends of the transistor is connected to the storage capacitor. In the connection structure formed in this way, the transistor functions as a switch. When a gate voltage inputted to the transistor in the WL structure is greater than a threshold voltage of the transistor, the transistor is turned on, and an electrical connection is formed between the storage capacitor and the BL structure. When the voltage of the storage capacitor is less than the voltage of the BL structure, the storage capacitor is discharged, which is a process of data reading. When the voltage of the storage capacitor is greater than the voltage of the BL structure, the storage capacitor is charged, which is a process of data writing. It can be known from the contents above that data reading/writing of the memory is implemented by charging/discharging the storage capacitor in the memory. Moreover, in charging, a certain amount of time is required to ensure the execution of a charging process, i.e., a certain amount of time needs to be reserved for the writing of data in the memory to ensure the complete writing of the data.

Figure 2:
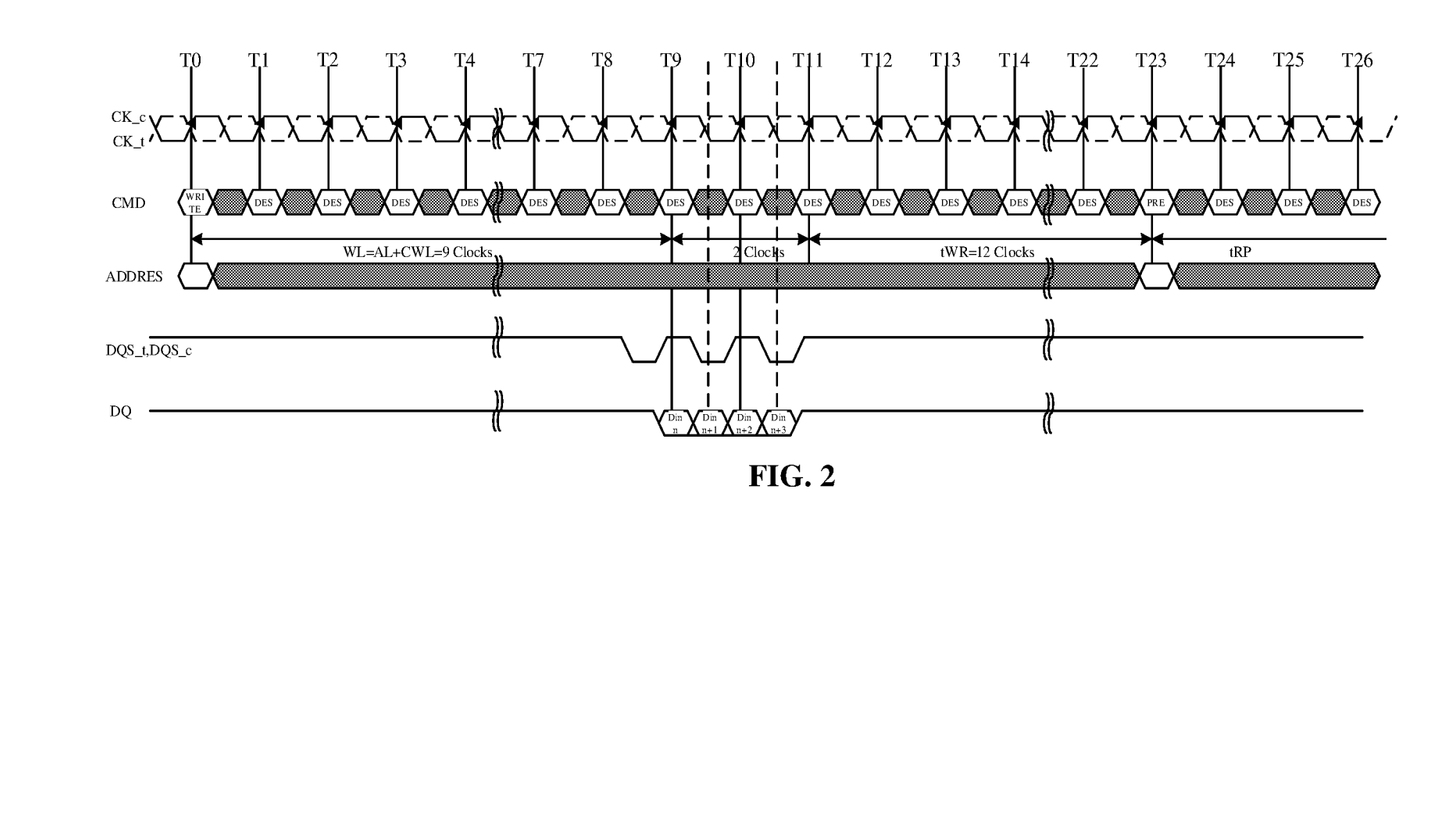
FIG. 2 is a schematic structural diagram of a writing time sequence of the memory according to the first embodiment of this application.

Referring to FIG. 2, FIG. 2 is a time sequence diagram of data writing performed in a memory. It should be noted that FIG. 2 is only a schematic diagram of a writing time sequence for a section of storage area, does not constitute a limitation to the embodiments of this application, and aims to make a person skilled in the art understand the implementation purpose of the present solution. As shown in FIG. 2, a command for executing data writing is received at time T0. Since the memory includes lots of storage capacitors, it is necessary to find a target storage capacitor before performing data writing, i.e., T1 to T9 is addressing time. After the target storage capacitor is found, a writing operation is started to perform. T9 to T11 are used for the execution of a writing process. T11 to T23 are spare time for ensuring the complete execution of writing, i.e., Write Recovery Time (tWR). A pre-charging process is performed after T23. After data is written, the BL structure needs to be pre-charged to enable the memory to normally execute the next operation command T9 to T23 are data writing time of the memory.

Before the memory operates, a preset writing time is set for the memory and used for data writing of the memory. In the actual operating process of the memory, due to factors such as the temperature of the transistor and the substrate bias voltage of the sense amplification transistor in the sense amplifier, the actual data writing time of the memory may be affected. When the actual data writing time of the memory is less than or equal to the preset writing time, the data writing of the memory is normally executed, and in this case, spare time exists. When the actual data writing time of the memory is greater than the preset writing time, the data writing of the memory cannot be normally executed. And if the preset writing time is set too long, the reading and writing efficiency of the memory is low. It should be noted that, in the embodiments of this application, the temperature of the transistor refers to the temperature of the transistor itself.

Referring to FIG. 3, the method for adjusting a memory includes the following steps.

It should be noted that according to the embodiments of this application, the influence of the temperature of the transistor on the actual data writing time of the memory is compensated for mainly by adjusting the substrate bias voltage of the sense amplification transistor in the sense amplifier, which does not mean that other conditions do not affect the actual data writing time of the memory. In the embodiments of this application, in addition to the temperature of the transistor and the substrate bias voltage of the sense amplification transistor in the sense amplifier, other conditions that affect the actual data writing time of the memory are kept unchanged by default.

At step 101, a first mapping relationship between a temperature and an actual data writing time is acquired.

A decrease in the temperature of the transistor causes an increase in contact resistance R of the transistor, and a decrease in the temperature of the transistor causes an increase in a threshold voltage Vth of the transistor. Accordingly, an increase in the temperature of the transistor causes a decrease in the contact resistance R of the transistor, and an increase in the temperature of the transistor causes a decrease in the threshold voltage Vth of the transistor.

It can be known from the foregoing structure description that when the transistor is turned on, an electrical connection is formed between the BL structure and the storage capacitor. When the transistor is turned on, a gate voltage Vgs of the transistor is greater than Vth, and a difference Vgs–Vth between Vgs and Vth is positively correlated with a source-drain current Ids of the transistor. That is, the greater the difference Vgs–Vth between Vgs and Vth is, the greater the Ids is. The Ids is used as a charging current of the storage capacitor. The greater the Ids is, the shorter the actual data writing time of the memory is.

That is, if the temperature of the transistor decreases, the threshold voltage Vth increases, the source-drain current Ids of the transistor decreases, and the actual data writing time of the memory becomes longer. If the temperature of the transistor increases, the threshold voltage Vth decreases, the source-drain current Ids of the transistor increases, and the actual data writing time of the memory becomes shorter.

Specifically, an operation of acquiring the first mapping relationship may include the following operations. The substrate bias voltage of the sense amplification transistor in the sense amplifier is maintained unchanged, the temperature of the transistor is changed, and then a first mapping relationship between the temperature of the transistor and the actual data writing time of the memory is acquired. Herein, the first mapping relationship is a two-dimensional mapping relationship, an independent variable is the temperature of the transistor, and a dependent variable is the actual data writing time of the memory. Then, the substrate bias voltage of the sense amplification transistor in the sense amplifier is changed, the substrate bias voltage of the sense amplification transistor in the sense amplifier is maintained unchanged after the substrate bias voltage of the sense amplification transistor in the sense amplifier is changed, the temperature of the transistor is changed, and then a first mapping relationship between the temperature of the transistor and the actual data writing time of the memory is acquired so that first mapping relationships between the actual data writing time of the memory and the temperature of the transistor under different substrate bias voltages of the sense amplification transistor in the sense amplifier are acquired.

At step 102, a second mapping relationship between the substrate bias voltage and the actual data writing time is acquired.

When the transistor is in a linear amplification area and the gate voltage Vgs of the transistor does not change, the source-drain current Ids of the transistor is positively correlated with a source-drain voltage Vds of the transistor. That is, the greater the Vds is, the greater the Ids is. It can be known from the foregoing description that the source-drain current Ids of the transistor is increased, the data writing time of the storage capacitor is decreased. Since the sense amplification transistor in the sense amplifier has a substrate bias voltage Vbs and the substrate bias voltage Vbs is a negative value (the transistor is an NMOS transistor by default), a p-n junction between a substrate and a source is reverse-biased, thus causing the threshold voltage Vth of the transistor to be too large, and the source-drain current Ids of the transistor to be too small.

In this case, the smaller the Vbs of the amplification transistor is, the more serious the extent of the reverse bias voltage of the p-n junction between the substrate and the source of the amplification transistor is, causing the threshold voltage Vth of the amplification transistor to increase, the amplification effect of the sense amplifier to decrease, and the source-drain voltage Vds supplied to the transistor to decrease, so that the source-drain current Ids of the transistor decreases, and the data writing time of the storage capacitor becomes longer. Accordingly, the greater the Vbs of the amplification transistor is, the slighter the extent of the reverse bias voltage of the p-n junction between the substrate and the source of the amplification transistor is, causing the threshold voltage Vth of the amplification transistor to decrease, the amplification effect of the sense amplifier to increase, and the source-drain voltage Vds supplied to the transistor to increase, so that the source-drain current Ids of the transistor increases, and the data writing time of the storage capacitor becomes shorter.

Specifically, an operation of acquiring the second mapping relationship may include the following operations. The temperature of the transistor is maintained unchanged, the substrate bias voltage of the sense amplification transistor in the sense amplifier is changed, then the second mapping relationship between the substrate bias voltage of the sense amplification transistor in the sense amplifier and the actual data writing time of the memory is acquired. Herein, the second mapping relationship is a two-dimensional mapping relationship, an independent variable is the substrate bias voltage of the sense amplification transistor in the sense amplifier, and a dependent variable is the actual data writing time of the memory. Then, the temperature of the transistor is changed, the temperature of the transistor is maintained unchanged after the temperature of the transistor is changed, the substrate bias voltage of the sense amplification transistor in the sense amplifier is changed, then the second mapping relationship between the substrate bias voltage of the sense amplification transistor in the sense amplifier and the actual data writing time of the memory is acquired, so that the second mapping relationships between the actual data writing time of the memory and the substrate bias voltage change of the sense amplification transistor in the sense amplifier at different temperatures are acquired.

At step 103, a mapping relationship among the temperature, the substrate bias voltage and the actual data writing time is acquired.

Specifically, the mapping relationship among the temperature of the transistor, the substrate bias voltage of the sense amplification transistor in the sense amplifier, and the actual data writing time of the memory is acquired on the basis of the first mapping relationship and the second mapping relationship. The mapping relationship is a three-dimensional mapping relationship.

It should be noted that in this embodiment, step 101, step 102, and step 103 provide a specific method for acquiring the mapping relationship among the temperature of the transistor, the substrate bias voltage of the sense amplification transistor in the sense amplifier, and the actual data writing time of the memory, the data corresponds one-to-one to each other to ensure the accuracy of adjustment and control of the actual data writing time of the memory. In other embodiments, the mapping relationship may be acquired directly by adjusting the relationship among the temperature of the transistor, the substrate bias voltage of the sense amplification transistor in the sense amplifier, and the actual data writing time of the memory.

At step 104, a current temperature of the transistor is acquired.

Specifically, in this embodiment, the current temperature of the transistor is acquired by means of a temperature sensor provided in the memory. The current temperature of the transistor directly acquired by means of the temperature sensor has a high accurate and small error. In other embodiments, the current temperature of the transistor may also be acquired by acquiring an ambient temperature at which the memory operates.

At step 105, a preset temperature and a temperature difference between the current temperature and the preset temperature are acquired.

At step 106, the substrate bias voltage is adjusted according to the temperature difference and the mapping relationship. In this embodiment, the operation of adjusting the substrate bias voltage according to the temperature difference and the mapping relationship may include the following operations.

At step 116, a time difference between the actual data writing time corresponding to the current temperature and the preset writing time is acquired.

A preset temperature of the transistor, a preset substrate bias voltage of the sense amplification transistor in the sense amplifier, and a preset writing time of the transistor are set before the memory is powered on to operate. The preset temperature, the preset substrate bias voltage, and the preset writing time may also satisfy the foregoing mapping relationship.

According to the temperature difference between the current temperature and the preset temperature, the time difference between the actual data writing time and the preset writing time of the memory under the current substrate bias voltage is acquired. That is, a change in the actual data writing time of the memory due to the temperature change is acquired.

At step 126, the substrate bias voltage is adjusted according to the mapping relationship and the time difference to compensate for the time difference.

Due to the temperature change of the transistor, the actual data writing time of the memory is changed, but this change is not conducive to the use of the memory. Therefore, it is necessary to adjust and control the substrate bias voltage of the sense amplification transistor in the sense amplifier to stabilize the actual data writing time of the memory. That is, the substrate bias voltage is adjusted to compensate for the time difference, thereby stabilizing the actual data writing time of the memory.

Compared with the prior art, since temperature affects the actual data writing time of the memory, the mapping relationship among the temperature of the transistor, the substrate bias voltage of the sense amplification transistor in the sense amplifier, and the actual data writing time of the memory is first acquired, the actual data writing time of the memory is acquired according to the current temperature of the transistor, and the actual data writing time of the memory at the current temperature of the transistor is adjusted by adjusting the substrate bias voltage of the sense amplification transistor in the sense amplifier, so that the adjusted data writing time of the memory is within a preset time, thus ensuring that the data is completely written into the storage capacitor.

The division of the steps above is only for clarity of description, and the steps above can be combined into one step during implementation, or some steps may be divided into multiple steps, and as long as the multiple steps include the same logical relationship, the multiple steps all fall within the scope of protection of this patent. All insignificant modifications to the flow or the introduction of insignificant designs without changing the core design of the flow fall within the scope of protection of the patent.

The second embodiment of this application relates to a method for adjusting a memory, and the difference from the first embodiment is that in this embodiment, whether the temperature difference exceeds a preset range is first determined before the substrate bias voltage is adjusted and controlled according to the temperature difference, and the actual data writing time is adjusted only when the temperature difference exceeds the preset range, thus reducing unnecessary adjustment operations and reducing adjustment cost.

Figure 4:
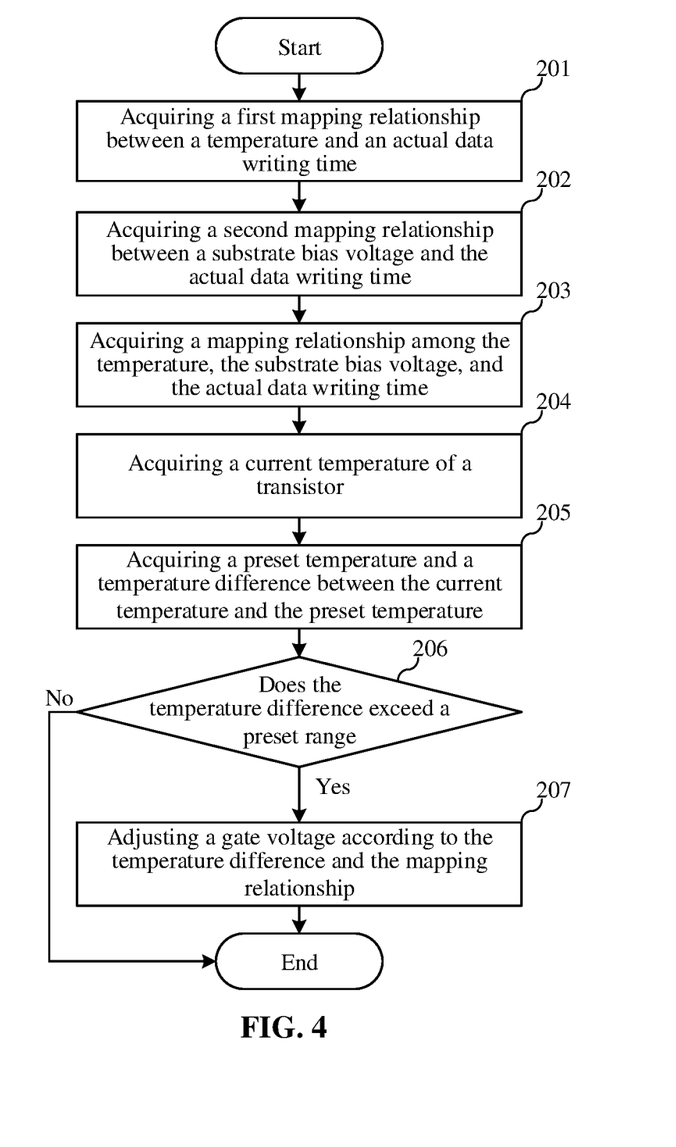
FIG. 4 is a schematic flowchart of a method for adjusting a memory according to a second embodiment of this application.

FIG. 4 is a schematic flowchart of a method for adjusting a memory according to an embodiment of this application. The method for adjusting a memory of this embodiment is specifically described below.

Referring to FIG. 4, the method for adjusting a memory includes the following steps:

At step 201, a first mapping relationship between a temperature and an actual data writing time is acquired.

At step 202, a second mapping relationship between a substrate bias voltage and the actual data writing time is acquired.

At step 203, a mapping relationship among the temperature, the substrate bias voltage, and the actual data writing time is acquired.

At step 204, a current temperature of the transistor is acquired.

At step 205, a preset temperature and a temperature difference between the current temperature and the preset temperature are acquired.

Step 201 to step 205 are the same as step 101 to step 105 in the first embodiment, and details are not described in this embodiment again.

At step 206, whether the temperature difference exceeds a preset range is determined.

In this embodiment, it is also determined whether the temperature difference between the current temperature of the transistor and the preset temperature exceeds the preset range before the substrate bias voltage of the sense amplification transistor in the sense amplifier is adjusted.

If the temperature difference exceeds the preset range, the adjustment of the substrate bias voltage of the sense amplification transistor in the sense amplifier according to the temperature difference and the mapping relationship is executed, i.e., step 207 is executed.

At step 207, the substrate bias voltage is adjusted according to the temperature difference and the mapping relationship.

Specifically, if the current temperature is greater than the preset temperature and the difference exceeds the preset range, and the transistor is an N-type transistor, the adjusting mode is to increase the substrate bias voltage. If the current temperature is lower than the preset temperature and the difference exceeds the preset range, and the transistor is an N-type transistor, the adjusting mode is to decrease the substrate bias voltage. If the current temperature is greater than the preset temperature and the difference exceeds the preset range, and the transistor is a P-type transistor, the adjusting mode is to decrease the substrate bias voltage. If the current temperature is lower than the preset temperature and the difference exceeds the preset range, and the transistor is a P-type transistor, the adjusting mode is to increase the substrate bias voltage.

Furthermore, in this embodiment, the preset range is further divided. The preset range at least includes a first preset range and a second preset range, and the second preset range is greater than the first preset range.

If the temperature difference exceeds the first preset range and does not exceed the second preset range, the substrate bias voltage is increased or decreased, and the amount of increase or decrease is a first preset value. If the temperature difference exceeds the second preset range, the substrate bias voltage is increased or decreased, the amount of increase or decrease is a second preset value, the second preset value is greater than the first preset value, and the first preset value and the second preset value are fixed values. By performing segmented adjustment and control on the preset range, the accuracy of adjusting the actual data writing time of the memory is improved while the adjustment cost is reduced.

It should be noted that in other embodiments, the preset range is divided into at least three sub preset ranges. By dividing the preset range into more preset sub-ranges, the accuracy of adjusting the actual data writing time of the memory is further improved.

Compared with the prior art, since temperature affects the actual data writing time of the memory, the mapping relationship among the temperature of the transistor, the substrate bias voltage of the sense amplification transistor in the sense amplifier, and the actual data writing time of the memory is first acquired, the actual data writing time of the memory is acquired according to the current temperature of the transistor, and the actual data writing time of the memory at the current temperature of the transistor is adjusted by adjusting the substrate bias voltage of the sense amplification transistor in the sense amplifier, so that the adjusted data writing time of the memory is within a preset time, thus ensuring that the data is completely written into the storage capacitor.

The division of the steps above is only for clarity of description, and the steps above can be combined into one step during implementation, or some steps may be divided into multiple steps, and as long as the multiple steps include the same logical relationship, the multiple steps all fall within the scope of protection of this patent. All insignificant modifications to the flow or the introduction of insignificant designs without changing the core design of the flow fall within the scope of protection of the patent.

The third embodiment of this application relates to a system for adjusting a memory.

Figure 5:
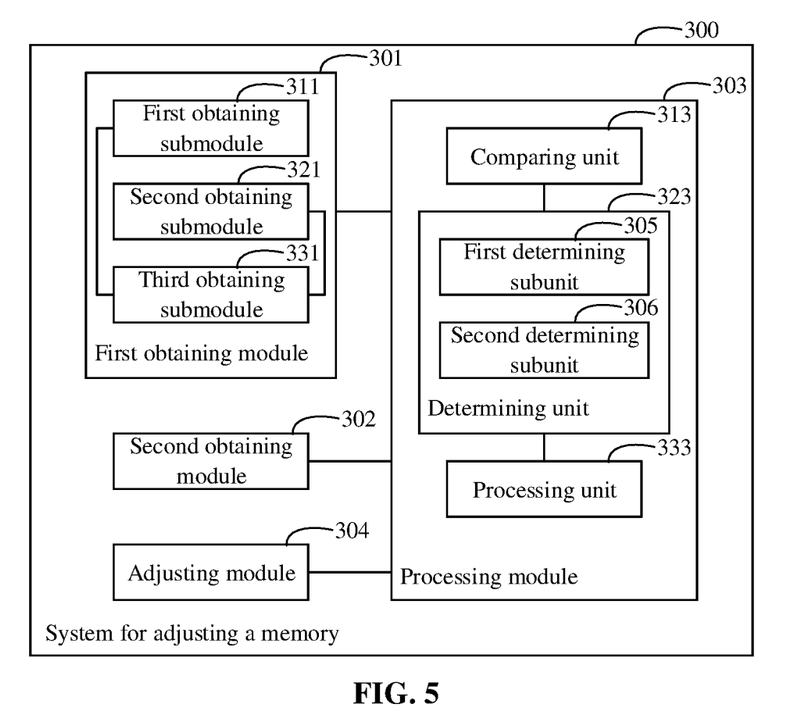
FIG. 5 is a schematic structural diagram of a system for adjusting a memory according to a third embodiment of this application.

Referring to FIG. 5, the system for adjusting a memory provided in this embodiment is described in detail below with reference to the accompanying drawings, and for the parts that are the same as or correspond to the first embodiment and the second embodiment, details are not described below.

The system 300 for adjusting a memory includes a first acquiring module 301, a second acquiring module 302, a processing module 303 and an adjusting module 304.

The first acquiring module 301 is configured to acquire a mapping relationship among a temperature of a transistor, a substrate bias voltage of a sense amplification transistor in a sense amplifier, and an actual data writing time of the memory. The mapping relationship is a three-dimensional mapping relationship.

The second acquiring module 302 is configured to acquire a current temperature of the transistor.

Specifically, in this embodiment, the current temperature of the transistor is acquired by means of a temperature sensor provided in the memory. The current temperature of the transistor directly acquired by means of the temperature sensor has a high accurate and small error. In other embodiments, the current temperature of the transistor may also be acquired by acquiring an ambient temperature at which the memory operates.

The processing module 303 is configured to acquire an adjusting mode of the substrate bias voltage on the basis of the current temperature and the mapping relationship.

In this embodiment, the processing module includes: a comparing unit 313 and a processing unit 333.

The comparing unit 313 is configured to acquire a preset temperature corresponding to the preset writing time, and acquire a temperature difference between the current temperature and the preset temperature.

The processing unit 333 is configured to acquire the adjusting mode of the substrate bias voltage according to the temperature difference and the mapping relationship.

Specifically, a preset temperature of the transistor, a preset substrate bias voltage of the sense amplification transistor in the sense amplifier, and a preset writing time of the memory are set before the memory is powered on to operate. The preset temperature, the preset substrate bias voltage, and the preset writing time may also satisfy the foregoing mapping relationship. The processing unit 333 acquires a time difference between the actual data writing time and the preset writing time of the memory under the current substrate bias voltage according to the temperature difference between the current temperature and the preset temperature. That is, a change in the actual data writing time of the memory due to temperature change is acquired. Due to the temperature change of the transistor, the actual data writing time of the memory is changed, but this change is not conducive to the use of the memory. Therefore, it is necessary to adjust and control the substrate bias voltage of the sense amplification transistor in the sense amplifier by the processing unit 333 to stabilize the actual data writing time of the memory. That is, according to the mapping relationship and the time difference, the substrate bias voltage is adjusted to compensate for the time difference, thereby stabilizing the actual data writing time of the memory.

The adjusting module 304 is configured to adjust the substrate bias voltage on the basis of the adjusting mode, so that the actual data writing time of the memory corresponding to the adjusted substrate bias voltage is within the preset writing time.

In an example, the first acquiring module 301 includes: a first acquiring submodule 311, a second acquiring submodule 321, and a third acquiring submodule 331.

The first acquiring submodule 311 is configured to acquire a first mapping relationship between the temperature of the transistor and the actual data writing time of the memory. Specifically, the substrate bias voltage of the sense amplification transistor in the sense amplifier is maintained unchanged, and the first mapping relationship between the temperature of the transistor and the actual data writing time of the memory is acquired, where an independent variable is the temperature of the transistor, an dependent variable is the actual data writing time of the memory, and the first mapping relationship is a two-dimensional mapping relationship.

The second acquiring submodule 321 is configured to acquire a second mapping relationship between the substrate bias voltage of the sense amplification transistor in the sense amplifier and the actual data writing time. Specifically, the temperature of the transistor is maintained unchanged, and the second mapping relationship between the substrate bias voltage of the sense amplification transistor in the sense amplifier and the actual data writing time of the memory is acquired, where an independent variable is the substrate bias voltage of the sense amplification transistor in the sense amplifier, a dependent variable is the actual data writing time of the memory, and the second mapping relationship is a two-dimensional mapping relationship.

The third acquiring submodule 331 is configured to acquire a mapping relationship among the temperature of the transistor, the substrate bias voltage of the sense amplification transistor in the sense amplifier, and the actual data writing time of the memory on the basis of the first mapping relationship and the second mapping relationship.

In an example, the processing module 303 further includes: a determining unit 323 configured to determine whether the temperature difference exceeds a preset range. When the temperature difference exceeds the preset range, the processing unit 333 is configured to acquire the adjusting mode of the substrate bias voltage according to the temperature difference and the mapping relationship.

Specifically, the determining unit 323 at least includes a first determining subunit 305 and a second determining subunit 306. By performing segmented adjustment and control on the preset range, the accuracy of adjusting the actual data writing time of the memory is improved while the adjustment cost is reduced.

The first determining subunit 305 is configured to determine whether the temperature difference exceeds a first preset range.

The second determining subunit 306 is configured to determine whether the temperature difference exceeds a second preset range. The second preset range is greater than the first preset range.

It should be noted that in other embodiments, the determining unit includes at least three determining subunits. The preset range is divided into at least three sub preset ranges. By dividing the preset range into more sub preset ranges, the accuracy of adjusting the actual data writing time of the memory is further improved.

Compared with the prior art, since temperature affects the actual data writing time of the memory, the first acquiring module acquires the mapping relationship among the temperature of the transistor, the substrate bias voltage of the sense amplification transistor in the sense amplifier, and the actual data writing time of the memory; the second acquiring module acquires the current temperature of the transistor and the actual data writing time of the memory; the processing module acquires the adjusting mode of the substrate bias voltage of the sense amplification transistor in the sense amplifier; and then the adjusting module adjusts the actual data writing time of the memory at the current temperature of the transistor by adjusting the substrate bias voltage of the sense amplification transistor in the sense amplifier, so that the adjusted data writing time of the memory is within the preset time, thus ensuring that the data is completely written into the storage capacitor.

It is worth mentioning that all the modules involved in this embodiment are logic modules. In practical applications, a logic unit may be a physical unit, may also be a part of a physical unit, and may also be implemented as a combination of multiple physical units. In addition, in order to highlight the innovative part of this application, this embodiment does not introduce units that are not closely related to solving the technical problem proposed by this application, but this does not indicate that no other units exist in this embodiment.

Since the first embodiment and the second embodiment correspond to this embodiment, this embodiment may be implemented in conjunction with the first embodiment and the second embodiment. The related technical details mentioned in the first embodiment and the second embodiment are still effective in this embodiment, the technical effects that can be achieved in the first embodiment and the second embodiment can also be achieved in this embodiment. In order to reduce repetition, details are not described herein again. Accordingly, the related technical details mentioned in this embodiment may also be applied to the first embodiment and the second embodiment.

A fourth embodiment of this application relates to a semiconductor device.

The semiconductor device may include a memory and the system for adjusting a memory provided in the third embodiment. The system for adjusting a memory adjusts the substrate bias voltage of the sense amplification transistor in the sense amplifier on the basis of the temperature of the transistor in the memory, so that the actual data writing time corresponding to the adjusted substrate bias voltage is within the preset writing time.

Since the first embodiment and the second embodiment correspond to this embodiment, this embodiment may be implemented in conjunction with the first embodiment and the second embodiment. The related technical details mentioned in the first embodiment and the second embodiment are still effective in this embodiment, the technical effects that can be achieved in the first embodiment and the second embodiment can also be achieved in this embodiment. In order to reduce repetition, details are not described herein again. Accordingly, the related technical details mentioned in this embodiment may also be applied to the first embodiment and the second embodiment.

A person of ordinary skill in the art can understand that the foregoing embodiments are specific embodiments for implementing this application. Moreover, in practical applications, various changes may be made to the embodiments in form and details without departing from the spirit and scope of this application.

INDUSTRIAL APPLICABILITY

The embodiments of this application provide a method for adjusting a memory and a system for adjusting a memory. In the method provided by the embodiments of this application, a substrate bias voltage is adjusted according to a mapping relationship among a temperature of a transistor, a transistor substrate bias voltage of a sense amplifier, and an actual data writing time of a memory. In this way, by means of the sense amplifier provided in a memory device, the substrate bias voltage may be adjusted according to the temperature to adjust the actual data writing time of the memory at a current temperature, so that the adjusted data writing time of the memory is within a preset time, thus ensuring that the data is completely written into the storage capacitor.

The invention claimed is:

1. A method for adjusting a memory, the memory comprising a transistor, a gate of the transistor being electrically connected to a word line of the memory, one of a pair of source/drain ends of the transistor being electrically connected to a bit line of the memory via a sense amplifier and a second one of the pair of source/drain ends being electrically connected to a storage capacitor of the memory, and the method comprising:
   acquiring a mapping relationship among a temperature of the transistor, a substrate bias voltage of a sense amplification transistor in the sense amplifier, and an actual data writing time of the memory;
   acquiring a current temperature of the transistor; and
   adjusting the substrate bias voltage on a basis of the current temperature and the mapping relationship, such that an actual data writing time corresponding to an adjusted substrate bias is within a preset writing time.

2. The method for adjusting a memory of claim 1, wherein adjusting the substrate bias voltage on the basis of the current temperature and the mapping relationship comprises:
   acquiring a preset temperature corresponding to the preset writing time;
   acquiring a temperature difference between the current temperature and the preset temperature; and
   adjusting the substrate bias voltage according to the temperature difference and the mapping relationship.

3. The method for adjusting a memory of claim 2, further comprising: before adjusting the substrate bias voltage according to the temperature difference and the mapping relationship:
   determining whether the temperature difference exceeds a preset range; and
   when the temperature difference exceeds the preset range, adjusting the substrate bias voltage according to the temperature difference and the mapping relationship.

4. The method for adjusting a memory of claim 2, wherein adjusting the substrate bias voltage according to the temperature difference and the mapping relationship comprises:
   acquiring, according to the mapping relationship, a time difference between an actual data writing time corresponding to the current temperature and the preset writing time; and
   adjusting, according to the mapping relationship and the time difference, the substrate bias voltage, to compensate for the time difference.

5. The method for adjusting a memory of claim 3, wherein the preset range at least comprises a first preset range and a second preset range, the second preset range is greater than the first preset range, when the temperature difference exceeds the first preset range but does not exceed the second preset range, increasing or decreasing the substrate bias voltage, an amount of increasing or decreasing the substrate bias voltage is a first preset value; and when the temperature difference exceeds the second preset range, increasing or decreasing the substrate bias voltage, an amount of increasing or decreasing the substrate bias voltage is a second preset value, the second preset value is greater than the first preset value.

6. The method for adjusting a memory of claim 1, wherein acquiring the mapping relationship among the temperature of the transistor, the substrate bias voltage of the sense amplification transistor in the sense amplifier, and the actual data writing time of the memory comprises:

acquiring a first mapping relationship between the temperature of the transistor and the actual data writing time of the memory;

acquiring a second mapping relationship between the substrate bias voltage of the sense amplification transistor in the sense amplifier and the actual data writing time of the memory; and acquiring the mapping relationship among the temperature of the transistor, the substrate bias voltage of the sense amplification transistor in the sense amplifier, and the actual data writing time of the memory on a basis of the first mapping relationship and the second mapping relationship.

7. A system for adjusting a memory, applied to the memory, comprising:

a first acquirer, configured to acquire a mapping relationship among a temperature of a transistor, a substrate bias voltage of a sense amplification transistor in a sense amplifier, and an actual data writing time of the memory;

a second acquirer, configured to acquire a current temperature of the transistor;

a processor, configured to acquire an adjusting mode of the substrate bias voltage on a basis of the current temperature and the mapping relationship; and an adjuster, configured to adjust the substrate bias voltage on a basis of the adjusting mode, such that an actual data writing time corresponding to an adjusted substrate bias voltage is within a preset writing time.

8. The system for adjusting a memory of claim 7, wherein the second acquirer comprises a temperature sensor provided in the memory.

9. The system for adjusting a memory of claim 7, wherein the processor is configured to:

acquire a preset temperature corresponding to the preset writing time, and acquire a temperature difference between the current temperature and the preset temperature; and acquire the adjusting mode of the substrate bias voltage according to the temperature difference and the mapping relationship.

10. The system for adjusting a memory of claim 9, wherein the processor is further configured to:

determine whether the temperature difference exceeds a preset range; and when the temperature difference exceeds the preset range, acquire the adjusting mode of the substrate bias voltage according to the temperature difference and the mapping relationship.

11. The system for adjusting a memory of claim 10, wherein the processor is further configured to:

determine whether the temperature difference exceeds a first preset range, and determine whether the temperature difference exceeds a second preset range, wherein the second preset range is greater than the first preset range.

12. The system for adjusting a memory of claim 7, wherein the first acquirer is further configured to:

acquire a first mapping relationship between a temperature of the transistor and the actual data writing time of the memory;

acquire a second mapping relationship between the substrate bias voltage of the sense amplification transistor in the sense amplifier and the actual data writing time of the memory; and acquire the mapping relationship among the temperature of the transistor, the substrate bias voltage of the sense amplification transistor in the sense amplifier, and the actual data writing time of the memory on a basis of the first mapping relationship and the second mapping relationship.

13. A semiconductor device, comprising the memory and the system for adjusting a memory of claim 7, wherein the system for adjusting a memory adjusts the substrate bias voltage of the sense amplification transistor in the sense amplifier in the memory on a basis of the temperature of the transistor in the memory, so that the actual data writing time of the memory corresponding to the adjusted substrate bias voltage is within the preset writing time.

* * * * *